United States Patent
Klemmer

(10) Patent No.: US 7,356,312 B2
(45) Date of Patent: Apr. 8, 2008

(54) FRACTIONAL FREQUENCY SYNTHESIZER

(75) Inventor: Nikolaus Klemmer, Cary, NC (US)

(73) Assignee: Telefonaktiebolaget LM Ericsson (publ) (SE)

( * ) Notice: Subject to any disclaimer, the term of this patent is extended or adjusted under 35 U.S.C. 154(b) by 554 days.

(21) Appl. No.: 10/794,830

(22) Filed: Mar. 5, 2004

(65) Prior Publication Data

US 2005/0197073 A1    Sep. 8, 2005

(51) Int. Cl.
*H04B 1/40* (2006.01)
(52) U.S. Cl. ............ 455/76; 455/255; 455/256; 455/265
(58) Field of Classification Search .......... 455/76, 455/260, 255, 256, 265
See application file for complete search history.

(56) References Cited

U.S. PATENT DOCUMENTS

| | | | |
|---|---|---|---|
| 5,668,504 A | 9/1997 | Ramalho | |
| 5,854,576 A | 12/1998 | Swan | |
| 5,889,436 A | 3/1999 | Yeung et al. | |
| 5,910,740 A | 6/1999 | Underwood | |
| 6,194,971 B1 | 2/2001 | Glen et al. | |
| 6,337,601 B1 | 1/2002 | Klemmer | |
| 6,788,154 B2 * | 9/2004 | Maneatis | 331/45 |
| 2002/0140513 A1 | 10/2002 | Maneatis | |
| 2003/0198311 A1 * | 10/2003 | Song et al. | 375/376 |
| 2005/0068073 A1 * | 3/2005 | Shi et al. | 327/156 |

FOREIGN PATENT DOCUMENTS

EP    1206039    5/2002

OTHER PUBLICATIONS

A 1.8-GHz Self-Calibrated Phase-Locked Loop with Precise I/Q Matching; Park, et al.; 2001 IEEE; 7 pgs.

* cited by examiner

*Primary Examiner*—Nay Maung
*Assistant Examiner*—Tuan H. Nguyen
(74) *Attorney, Agent, or Firm*—Coats & Bennett, P.L.L.C.

(57) ABSTRACT

A frequency synthesizer circuit generates an output clock signal having a desired frequency relationship with an input reference signal, and offers essentially arbitrary relational values and adjustment resolution within any applicable circuit limits. The frequency synthesizer includes a ring oscillator circuit that provides multiple phases of its output clock signal, a phase selection circuit to select a phase of the output clock signal for feedback to an oscillator control circuit at each cycle of the reference signal according to a phase selection sequence. The oscillator control circuit generates a control signal responsive to comparing the selected phases of the output clock signal with the reference signal, and the phase selection circuit may include a modulator to generate phase selection sequences having desired time-average values that enable arbitrary frequency adjustability.

23 Claims, 5 Drawing Sheets

FRACTIONAL FREQUENCY SYNTHESIZER

BACKGROUND OF THE INVENTION

The present invention generally relates to clock signal generation and particularly relates to synthesizing desired clock frequencies.

Frequency synthesis can be defined broadly as the act of generating a desired frequency from one or more reference frequencies. For example, frequency synthesis may be used to create one or more output frequencies using a single reference frequency. Other forms of frequency synthesis derived desired output frequencies based on the interaction of two or more reference signals, each at a different frequency.

As might be imagined, frequency synthesis in its various forms finds widespread use across a variety of system and device types. One exemplary use of frequency synthesis is the creation of one or more system clock signals from a single reference frequency signal. Synthesizing the system clock signals from the same reference frequency ensures that all clock timing relates back to the same base frequency. Such synchronization can be important in sampled data systems wherein the process of converting analog signals into digitized samples must be carried out in synchronization with a microprocessor clock or other system clock.

The use of multiple frequencies synchronized to the same baseline reference frequency also is important in many types of communication systems, including wired (electrical and optical), and wireless communication systems. For example, mobile terminals typically use multiple frequencies in their operations, including different frequencies for receive/transmit signal mixing, filtering, down-conversion, signal digitization, and baseband digital processing. Because such operations typically must be performed in synchronization with a baseline system timing, such mobile terminals typically have a reference clock running at a baseline frequency, and typically employ one or more frequency synthesizers to generate one or more additional clock signals having desired frequency relationships to the reference clock signal.

Of course, such aspects and applications of frequency synthesis are well known to those skilled in the art, and certain forms of frequency synthesis can be implemented using relatively straightforward circuits, such as the use of simple multipliers and/or dividers to achieve synthesized frequencies that are integer multiples or factors of the reference frequency, e.g., 2×, 3×, ½×, ¼×. However, synthesis becomes more complicated when the desired frequency relationship between the reference and output signals has a fractional component.

SUMMARY OF THE INVENTION

The present invention comprises a method and apparatus to generate a clock signal with an essentially arbitrary frequency relationship to a reference signal. In particular, the present invention provides an exemplary frequency synthesis method based on using multiple output phases of a ring oscillator circuit to achieve arbitrarily small frequency adjustment steps for the output clock signal, thereby making possible the accurate synthesis of arbitrarily valued frequencies relative to a reference frequency. As such, the present invention provides a basis for very precisely setting the frequency of a clock signal. For example, the present invention may be used to apply frequency corrections in the order of just a few parts-per-million (ppm) such that small errors in a reference frequency signal can be nullified.

Broadly, the present invention comprises a frequency synthesis circuit including a selectable-phase ring oscillator circuit that generates an output clock signal at a desired frequency relative to an input reference signal frequency. The output frequency depends on the phase selection sequence used to drive the ring oscillator circuit during its operation, and the exemplary circuit includes a phase selection generator that can generate phase selection sequences having effective fractional or non-fractional phase selection step sizes as needed to achieve the desired frequency relationship.

Thus, in an exemplary embodiment, the present invention comprises a method of generating an output clock signal having a desired frequency relationship to a reference signal. This exemplary method comprises generating the output clock signal in a ring oscillator circuit that provides different phases of the output clock signal, controlling an oscillation frequency of the ring oscillator circuit based on selecting a phase of the output clock signal at each cycle of the reference signal and comparing the selected phase of the output clock signal to the reference signal, and generating a phase selection sequence for selecting phases of the output clock signal to effect the desired frequency relationship.

In another exemplary embodiment, the present invention comprises a frequency synthesizer circuit. Thus, the exemplary circuit comprises a ring oscillator circuit configured to generate an output clock signal and to provide different phases of the output clock signal, an oscillator control circuit configured to control an oscillation frequency of the ring oscillator circuit based on comparing a selected phase of the output clock signal to a reference signal at each cycle of the reference signal, and a phase selection circuit configured to generate a phase selection sequence corresponding to a desired frequency relationship between the reference signal and the output clock signal, and to feedback selected phases of the output clock signal to the oscillator control circuit according to the phase selection sequence.

In accordance with one or more exemplary embodiments of the present invention, an exemplary phase selection circuit is configured to control the frequency of the output clock signal by selecting a different phase of the output clock signal for feedback to the oscillator control circuit at each cycle of the reference signal according to a phase selection sequence. The phase selection circuit may be configured to generate phase selection sequences having sequence averages corresponding to non-integer (fractional) phase selection step sizes in dependence on a frequency relationship between a desired frequency of the output clock signal and a frequency of the reference signal. That is, the present invention enables the exemplary frequency synthesizer circuit to generate essentially any desired frequency relative to a reference signal frequency by generating phase selection sequences having time-averaged values corresponding to real-valued phase selection step sizes of arbitrarily fine resolution.

Of course, the present invention is not limited by the above summary information. Those skilled in the art will recognize other features and advantages upon reading the following discussion and upon viewing the accompanying figures.

DETAILED DESCRIPTION OF THE INVENTION

Numerous references appear throughout the following discussion regarding the configuration and use of frequency synthesizers according to the present invention in the context of wireless communication devices and/or systems, such as cellular radiotelephones, Portable Digital Assistants (PDAs), laptop/palmtop computers, etc. Indeed, one or more of the accompanying figures illustrate a wireless communication terminal that includes one or more such frequency synthesizers. However, it should be understood that the present invention has broad applicability to essentially any type of electronic device or system wherein flexible and precise frequency generation is useful.

Figure 1:
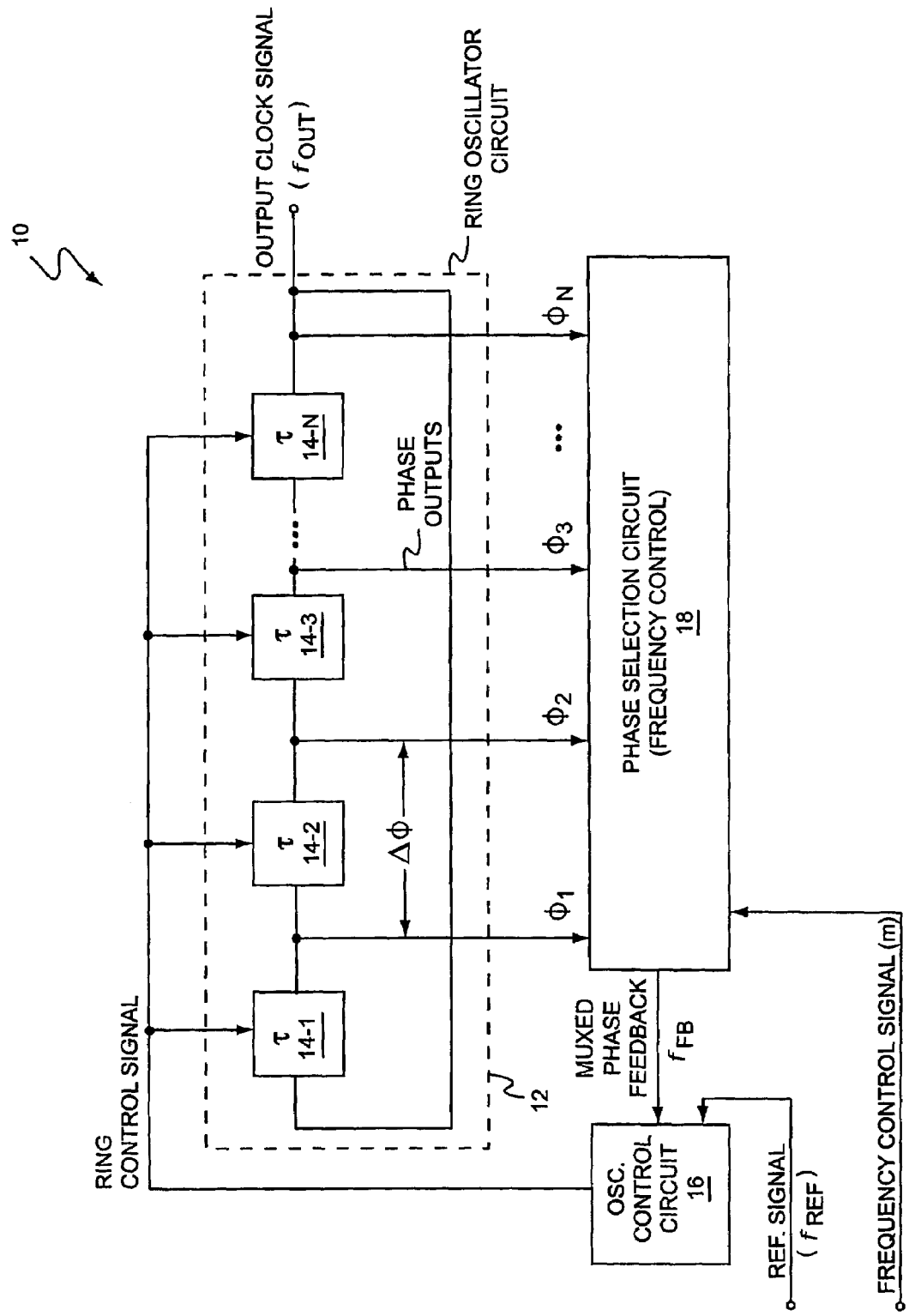
FIG. 1 is a diagram of an exemplary frequency synthesizer circuit according to the present invention.

With the above in mind, FIG. 1 illustrates an exemplary frequency synthesizer circuit 10 according to one or more embodiments of the present invention. As illustrated, the synthesizer circuit 10 comprises a ring oscillator circuit 12 that includes a plurality of delay stages 14, an oscillator control circuit 16, and a phase selection circuit 18. The synthesizer circuit 10 also is referred to as a phase-selectable ring oscillator circuit and its general operation is explained below.

Broadly, the frequency synthesizer circuit 10 is configured to generate an output clock signal having a desired frequency relationship to an input reference signal wherein that frequency relationship is determined by the phase selection sequence used to select the output clock signal phase fed back to the oscillator control circuit 16 at each successive cycle of the input reference signal. While those skilled in the art will recognize that basic ring oscillator circuits are known, the present invention uses inventive phase selection generation to generate output clock signal frequencies having arbitrary frequency relationships to the reference signal frequencies. Moreover, the same selection sequence generation methods can be used to provide arbitrarily fine adjustment of the output frequency, e.g., $<\pm 10$ ppm, and, can be used to provide dynamic compensation for crystal oscillator variations arising from temperature, process, and voltage changes.

In more detail, the ring oscillator circuit 12 is configured to generate an output clock signal and to provide different phases of that output clock signal. In turn, the oscillator control circuit 16 is configured to control the oscillation frequency of the ring 12 based on comparing a selected phase of the output clock signal to the reference signal at each cycle of the reference signal. The phase selection circuit 18 is configured to generate a phase selection sequence corresponding to the desired frequency relationship between the reference signal and the output clock signal, and to feedback selected phases of the output clock signal to the oscillator control circuit 16 according to the phase selection sequence as defined by the input frequency control signal.

With the above exemplary configuration, the frequency of the output clock signal can be set relative to the input reference frequency by setting the phase selection step size via the frequency control signal, m. More specifically, the phase selection circuit 18 selects a new phase of the output clock according to the value of m for feedback to the oscillator control circuit 16 at each cycle of the reference signal. In turn, the control circuit 16 generates a ring control signal that in an exemplary embodiment is proportional to the phase difference between the feedback phase of the output clock signal and the reference signal. The control signal generated by oscillator control circuit 16 varies the oscillation frequency of the ring 12, and its basic control function is given as, $$f_{FB} = \frac{1}{(2N+m)\tau} = f_{REF}, \quad (1)$$

and therefore $$\tau = \frac{1}{(2N+m)f_{REF}}. \quad (2)$$

Where $\tau$ is the unit delay of each stage 14 in the ring 12, $f_{FB}$ is the multiplexed feedback signal generated by selecting different phases of the output clock signal over successive cycles of the input reference signal, $f_{REF}$ is the frequency of the input reference signal, N equals the number of delay stages 14, and m is the phase selection stepping size for cycle-to-cycle selection of output clock phases by phase selection circuit 18.

In turn, the frequency $f_{OUT}$ of the output clock signal is given as, $$f_{OUT} = \frac{1}{2N\tau} = f_{REF}\frac{2N+m}{2N} = f_{REF}\left(1 + \frac{m}{2N}\right), \quad (3)$$

where m connotes the phase selection step size used to select successive phases of the output clock signal for feedback comparison to the input reference signal. According to the above equation, then, the desired output frequency can be set relative to the frequency of the input reference signal based on setting m as, $$m = \left(\frac{f_{OUT}}{f_{REF}} - 1\right) \cdot 2N. \quad (4)$$

Figure 2:
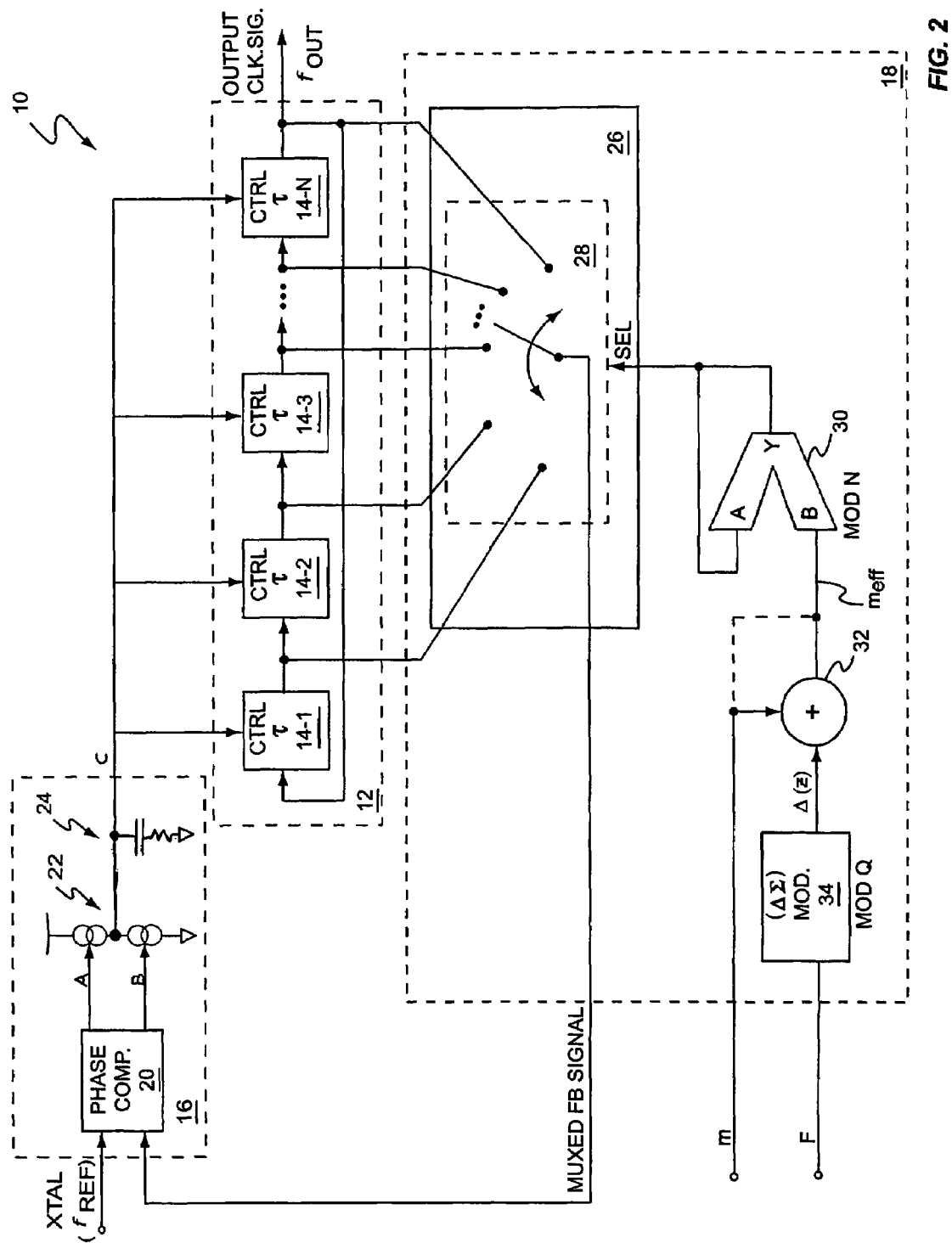
FIG. 2 is a diagram of exemplary details for the circuit of FIG. 1.

In the illustrations of FIGS. 1 and 2, a positive m indicates an advancing phase selection sequence that selects the next phase output feedback signal for comparison to the input reference signal by moving rightward by m delay stages 14 at each cycle of the reference signal. Conversely, a negative value of m indicates a retreating phase selection sequence that moves leftward by m delay stages at each cycle of the reference signal. A retreating phase selection sequence results in $f_{PUT}<f_{REF}$, while an advancing phase selection sequence results in $f_{OUT}>f_{REF}$. (The trivial case of m=0, i.e., no cycle-to-cycle phase stepping, results in $f_{OUT}=f_{REF}$.) Also, note that the selection sequence wraps around from the beginning to end of the ring 12 or vice versa, depending on the selection direction.

To better understand the above relationships, assume m equals −1, meaning that the phase selection circuit 18 uses a phase step size of 1, and moves leftward (earlier phases) as it selects a different phase of the output clock signal at each cycle of the reference signal. Thus, the phase selection sequence would be Phase N from stage 14-N, Phase N−1 from stage 14-(N−1), Phase N−2 from stage 14-(N−2), Phase N−3 from stage 14-(N−3), and so on. By advancing the feedback signal by one stage 14 at each comparison cycle of the input reference signal, the feedback signal's phase is early by an amount m×Δϕ (here, m=−1). Thus, from the perspective of the oscillator control circuit 16, the ring 12 appears to be running too fast, which causes control circuit 16 to slow the ring 12 down and thereby decrease its frequency. Setting m to −2 and stepping through the ring by two stages 14 per input reference signal cycle causes the feedback signal phase to appear too early by 2×Δϕ. Of course, the converse relationship works with positive values of m. For example, if m equals +2, the feedback signal appears to be too late by an amount 2×Δϕ at each cycle of the reference signal, which causes the control circuit 16 to increase the frequency of ring 12.

One of the advantages of the present invention is that the cycle-to-cycle phase selection step size m can be set to any effective value that is desired by generating an appropriate phase selection sequence. In other words, a sequence of phase selection step sizes can be generated to have any desired time-average value that can be a non-integer phase step size. As a simple example, the phase selection sequence is m={1, 1, 1, 0, 1, 1, 1, 0, 1, 1, 1, 0, . . . }. That sequence would cause the phase selection circuit 18 to advance rightward to the next delay stage's phase output three out of every four successive cycles of the reference signal. The effect of holding the currently selected phase over every fourth cycle of the reference signal is to have an effectively non-integer phase stepping size of m=0.75.

FIG. 2 illustrates exemplary details for the circuit of FIG. 1 and provides a basis for discussing additional details of circuit 10 that complement the generation of non-uniform phase selection sequences to obtain arbitrary-valued phase stepping sizes. Thus, the above discussion is expanded to consider frequency synthesis situations wherein the desired frequency relationship between the reference signal and the output clock signal cannot be achieved by integer phase step sizes. In one or more exemplary embodiments, the phase selection circuit 18 is configured to generate non-uniform phase selection sequences to achieve such frequency relationships. As used herein, the term "non-uniform" phase selection sequence connotes a phase selection sequence where the step size and or stepping direction may vary over successive cycles of the reference signal.

Turning to the additional diagram details, one sees that an exemplary oscillator control circuit 16 is configured as a phase-locked loop (PLL) that generates a delay control signal as a function of the phase difference between the multiplexed feedback signal and the input reference signal. An exemplary PLL-based phase detector configuration includes a phase comparator 20, a charge pump circuit 22, and a loop filter circuit 24 that in the illustration comprises a first-order RC filter. At each cycle of the input reference signal, the charge pump circuit 22 sources current to or sinks current from the loop filter circuit 24, depending on whether the feedback signal phase leads or lags the reference signal phase. The amount of current sourced or sunk by charge pump circuit 22 is proportional to the magnitude of the phase difference and the loop filter circuit 24 time-averages the charge pump output to create a smoothly varying delay control signal that is applied to each delay stage 14 in the ring 12.

Indeed, one of the many advantages provided by the frequency synthesis circuit 10 described herein is its per-cycle comparison operation. That is, the multiplexed feedback signal's relative phase is changed at each cycle of the input reference signal and the resulting phase adjustments of the control circuit 16 thus occur at the input reference frequency rather than at some reduced fraction of the input frequency. Making ring control signal corrections at the input reference frequency allows favorable setting of the roll-off frequency of the filter circuit 24.

In highlighting other illustrated details, note that phase selection circuit 18 comprises a multiplexer circuit 26 including a controllable switch 28, a modulo-N accumulator (Y=(A+B) mod N) 30, a summing circuit 32, and a sequence modulator 34 that comprises a modulo Q delta-sigma (ΔΣ) modulator in an exemplary embodiment. The switch 28 moves clockwise or counterclockwise a defined number of switch positions at each cycle of the reference signal in dependence on the value of the selection signal input, labeled as SEL in the drawing.

In elaborating on the functionality provided by the depicted circuit arrangement, the discussion returns to Eq. (4) given above in the context of modulator 34. Eq. (4) illustrated that $f_{OUT}$ is a function of $f_{REF}$ and m, i.e., $f_{OUT}$=f($f_{REF}$, m). In looking at that relationship, one sees that an arbitrary relationship can be achieved so long as the value of m can be set to an arbitrary value. For example, if m can be set to essentially any desired value within the range of $0.5f_{REF}$<m<$1.5f_{REF}$, then the frequency synthesizer circuit 10 can be used to make arbitrarily small corrections to $f_{REF}$. As will be discussed herein, such operation has particular advantages in correcting even very small frequency errors in a reference clock circuit to prevent such errors from causing timing drift in one or more clocked circuits that depend on the reference clock.

In these and other applications, the present invention provides a mechanism for creating essentially any effective value of m that is desired using modulator 34 or other "dithering" circuit to create the desired value m via non-uniform phase selection sequences. That is, modulator 34 provides a mechanism by which the phase selection circuit 18 can be configured to generate phase selection sequences having time-average values corresponding to fractional phase stepping sizes to thereby achieve arbitrary frequency relationships between $f_{OUT}$ and $f_{REF}$, and to provide arbitrarily fine adjustment resolution of $f_{OUT}$.

With the addition of modulator 34 and summer 32, the output frequency $f_{OUT}$ can be expressed as, $$f_{OUT}(z) = f_{REF}\left(1 + \frac{m + \Delta(z)}{2N}\right), \quad (5)$$

where Δ(z) is expressed as, $$\Delta(z) = \frac{F}{Q} + e_q(1 - z^{-1})^n, \quad (6)$$

where $e_q$ is the quantization error. One may assume an n-th order delta-sigma modulator configuration for modulator 34 with a generic noise transfer function (i.e., a cascade of integrators), a modulator modulus of Q, and a fractional input signal value F. Generally, F may be restricted within the range [−Q/2 . . . +Q/2].

Because of the digital nature of the quantizer in the delta-sigma modulator implementation, the smallest possible quantization step is one. With the quantization error being sufficiently random, the spectral density of $e_q$ is then $1/12 f_{REF}$. The integral of the quantization noise related frequency fluctuation leads to the single-sided power spectral density of the phase fluctuations of the output clock signal, which can be expressed as, $$S_\Phi(z) = \left(\frac{\pi}{N}\right)^2 \cdot \frac{1}{12 f_{REF}} \cdot |(1-z^{-1})|^{2(n-1)}, \text{ where } z = e^{-s/f_{REF}}. \quad (7)$$

The above result can be multiplied by the magnitude of the loop phase transfer function of the control circuit 16 and ring circuit 12, $|H(s)|^2$, to obtain the measurable output phase noise spectrum of the output clock signal. In accordance with one or more embodiments of the present invention, modulator 34 is configured to generate the phase stepping modulation signal $\Delta(z)$ such that the frequency spectrum of the output phase noise is outside the frequency range of interest for the output clock signal. That effect can be accomplished by, for example, ensuring that the phase selection pattern generated by the m+$\Delta(z)$ does not have periodic variations that repeat within the frequency range of interest.

In general, one should note that the sequence of phase stepping values formed by m+$\Delta(z)$ can have essentially any desired time-average value. For example, assuming that the desired frequency relationship between $f_{REF}$ and $f_{OUT}$ required an effective phase step size of 0.5. The value m can be generated as a sequence of 1s at the reference clock frequency, e.g., {1, 1, 1, 1, . . . } and modulator 34 can generate $\Delta(z)$ as an alternating sequence of −1s and 0s, e.g., {0, −1, 0, −1, . . . }, such that the average value of m+$\Delta(z)$ is 0.5. Of course, as just noted above, a more preferred averaging scheme might be implemented such that the phase selection sequence has a more random phase noise. As such, a better sequence might be m+$\Delta(z)$={1, 1, 1, 0, 1, 1, 0, 0, 1, 0, 0, 0, . . . }. Of course, those skilled in the art will appreciate that this simple example is in no way limiting regarding the phase selection sequences used by the present invention. In general, the phase selection sequences can be generated such that the variations in the phase selection value appear more noise like, or at least avoid exhibiting periodicity within the frequency range of interest.

In general, modulator 34 can be configured to have a desired resolution, e.g., 16-bit, 20-bit, etc., such that the time-average value of the phase selection sequence output by counter 30 has a desired accuracy. For example, 20-bit resolution in modulator 34 permits adjustment steps on the order of one-tenth ppm or less. In other words, the illustrated arrangement permits a system controller or other processor to set the value of F with an arbitrary level of precision to whatever real-valued number needed such that the combination of $\Delta(z)$+m results in counter 30 outputting a phase selection sequence that yields the desired output frequency. With this configuration, then, the frequency of the output clock signal can be expressed as, $$f_{OUT}(z) = f_{REF}\left(1 + \frac{m+F/Q}{2N}\right). \quad (8)$$

As a basis for a simple example, assume that $f_{REF}$=26.00 MHz, the desired $f_{REF}$=30.72 MHz (i.e., $f_{REF}$=$f_{REF}$×(1+59/325). Then, depending on the number of stages 14 in ring 12, the necessary parameters and quantizer level choices given in Table 1 below.

TABLE 1

Exemplary Parameter and Quantizer Values.

| N | m | F | Q | Δ |
|---|---|---|---|---|
| 4 | 1 | 147 | 325 | {0, 1} |
| 8 | 3 | −31 | 325 | {−1, 0, 1} |
| 16 | 6 | −62 | 325 | {−1, 0, 1} |
| 32 | 12 | −124 | 325 | {−1, 0, 1} |

Focusing on the case of N=8 delay stages 14 and quantizer output values {−1,0,1} from modulator 34, the cycle-to-cycle phase step sizes are in the range of m+$\Delta(z)$={2,3,4}. In the locked condition, each delay stage 14 has a delay of τ=1/(2×8×30.72 MHz)=2.03 ns.

Figure 3:
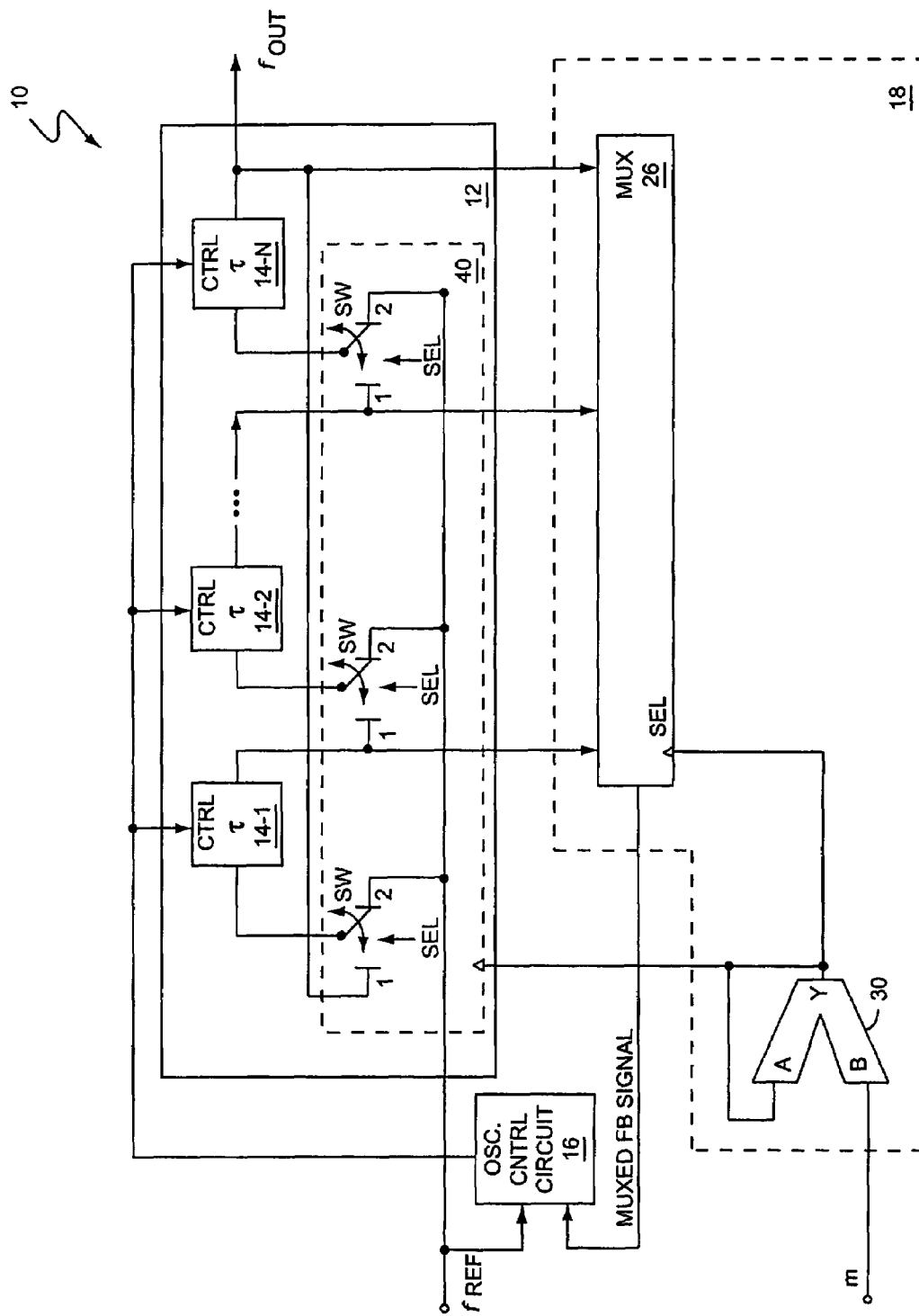
FIG. 3 is a diagram of exemplary jitter control circuit details.

Of course, the present invention is not limited to the circuit arrangements illustrated thus far. For example, circuit 10 can be modified to extend the range of $f_{OUT}$ to values less than $0.5 f_{REF}$ or greater than $1.5 f_{REF}$. Additionally or alternatively, circuit 10 can be modified to include jitter control. FIG. 3 illustrates an exemplary configuration of circuit 10 wherein the ring 12 includes a jitter control circuit 40 comprising a plurality of switches arranged as one switch per phase output of the ring 12. Jitter control operation is explained below.

In the locked condition of control circuit 16, signal edges of the reference signal align with corresponding edges in the multiplexed feedback signal provided by phase selection circuit 18. When in the locked condition, alignment differences between edges in the reference signal and in the feedback signal occur because of timing jitter. Edges in the reference signal can be used in the locked condition to reset the ring 12 at each cycle of the reference signal to remove accumulated timing jitter.

In more detail, when the control circuit 16 is in the locked condition, the jitter circuit's switches are reset at each cycle of the reference signal on a per clock phase basis to null timing jitter every cycle. Resetting each switch causes the switch to move to "Position 1" slightly before the reference signal edge arrives and to return to "Position 2" shortly after each reference edge. Thus, each successive stage 14 in the ring 12 is clocked at the right successive phase time but without any edge jitter that might have been accumulated in any preceding stages 14. Jitter control circuit 40 can be clocked at the reference frequency using the SEL signal or using some other signal having the appropriate frequency.

Figure 4:
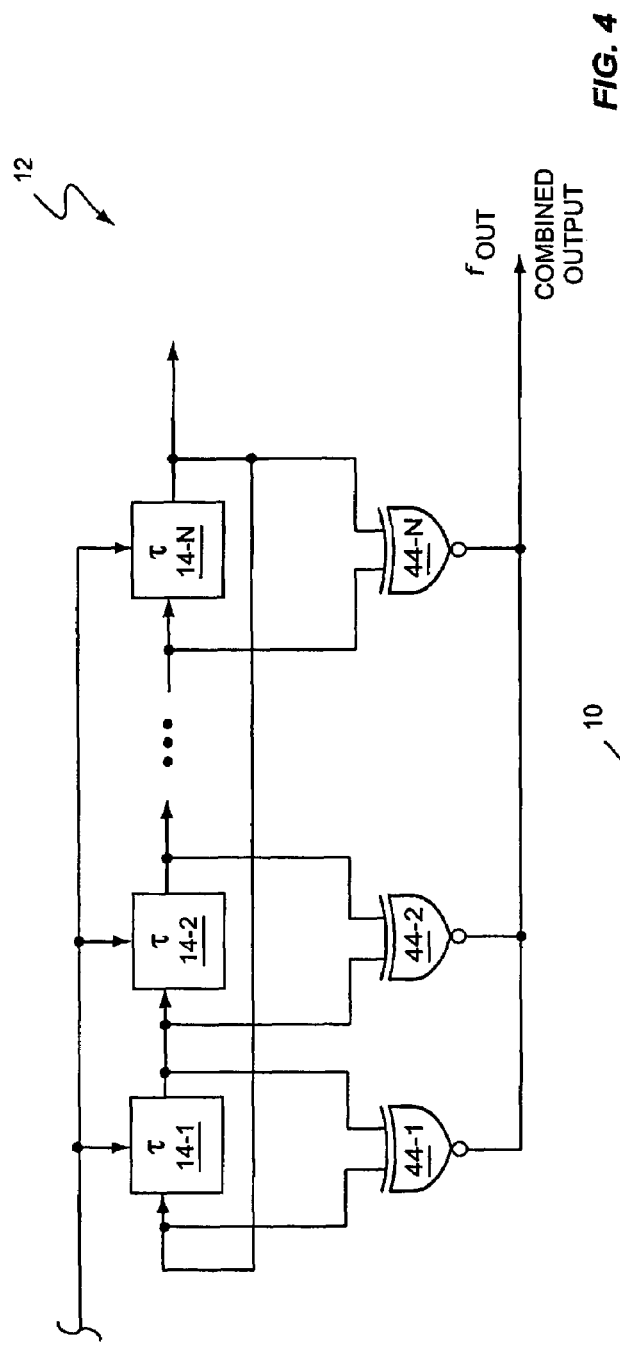
FIGS. 4 and 5 are diagrams of exemplary circuits to extend output frequency ranges.
Figure 5:
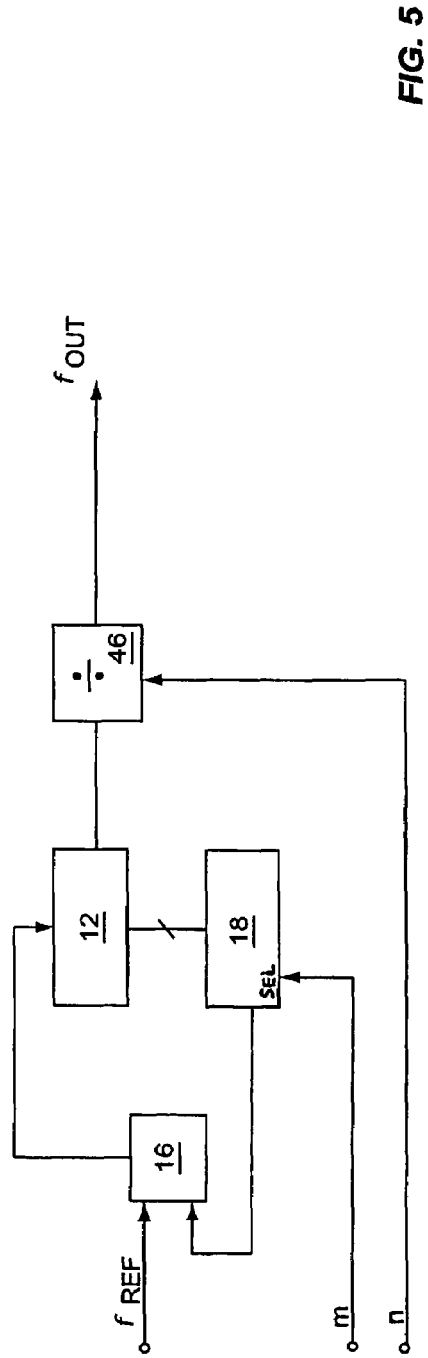

FIGS. 4 and 5 depict exemplary circuit arrangements for generating $f_{OUT}$ at multiples greater than $1.5 f_{REF}$ (FIG. 4) and less than $0.5 f_{REF}$ (FIG. 5). Those skilled in the art will appreciate that other circuit arrangements can be used to achieve the same effects. In any case, FIG. 4 illustrates the use of additional logic gates 44 (here, XOR gates) that provide two clock edges per delay stage 14 of ring 12. With this configuration, the signal frequency at the combined output will be N times higher than the fundamental reference frequency and thus can be expressed with respect to Eq. (8) as, $$f_{OUT}(z) = f_{REF}\left(N + \frac{m + F/Q}{2}\right). \quad (9)$$

With regard to FIG. 5, those skilled in the art will appreciate that the final output frequency can take on essentially any desired value by adjusting the divide-by value of divider 46, which may itself be a fractional divider.

Figure 6:
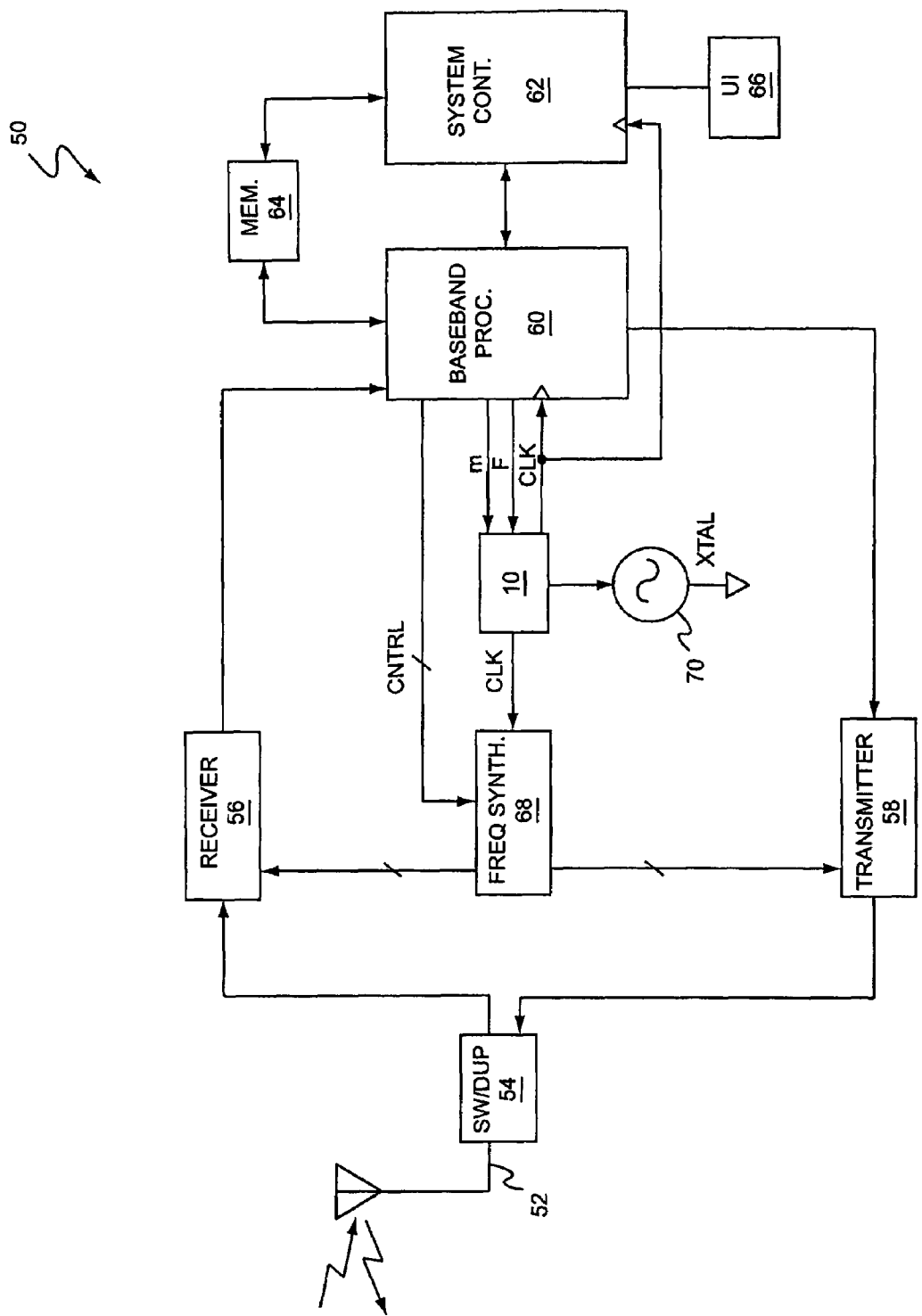
FIG. 6 is a diagram of an exemplary wireless communication terminal that includes one or more frequency synthesizers configured according to the present invention.

Any of the above embodiments may be employed in a wide variety of systems. FIG. 6 illustrates an exemplary embodiment wherein a wireless communication device 50, e.g., a mobile terminal for use in a wireless communication network, includes at least one frequency synthesizer circuit 10 configured according to the present invention. The illustrated device 50 comprises an antenna assembly that includes antenna 52 and switch/duplexer 54, and further comprises a receiver 56, a transmitter 58, a baseband signal processor 60, a system controller 62, one or more storage devices 64 (e.g., one or more memory circuits), a user interface 66 including, for example, a keypad, a display, a speaker, and a microphone, and an oscillator circuit 70 (e.g., a crystal oscillator).

Commonly, oscillator circuit 70 is configured to run at one or more reference frequencies that serve as the time base for the clocked operations of processor circuits in the wireless device. In wireless communication devices in particular, the reference frequency time base often is chosen to complement the communication signal timing of the overall wireless system.

While oscillator circuit 70 can be configured for high accuracy, such circuits typically manifest enough frequency error to cause timing drift in device 50. One approach to compensating for frequency errors in the oscillator circuit has been to generate receiver and transmitter frequencies that are corrected for the measured frequency errors of circuit 70—device 50 may use one or more received signals to determine such frequency errors. While that conventional approach corrects the frequencies used in radio signal transmission and reception, it leaves uncorrected the underlying fundamental frequency signal output by circuit 70 and thus introduces timing drift into the operations of any circuit clocked by circuit 70.

According to an exemplary embodiment of the present invention, frequency synthesizer circuit 10 is configured to generate its clock output signal as a corrected version of the reference frequency output by circuit 70. The output clock signal from circuit 10 thus can be used as the system clock for baseband processor circuit 60, system controller 62, and any additional frequency synthesizers 68, which may or may not be configured according to the present invention. In other words, an exemplary embodiment exploits the present invention's ability to make very fine frequency corrections, e.g., corrections in the ppm range, to null out measured errors in the reference frequency signal used by device 50 to time its overall communication signal processing operations.

As such, device 50 can be configured to determine the frequency error of oscillator circuit 70 using, for example, timing information derived from one or more received signals. While not shown explicitly, either baseband processor 60 and/or system controller 62 may receive a possibly divided down version of the output directly from oscillator circuit 70 and use that signal to measure timing errors. In any case, baseband processor 60 and/or system controller 62 determines the timing error of circuit 70 and generates m and F as needed to achieve the desired error nulling in the output clock signal from synthesizer circuit 10. That output clock signal thus provides an error-compensated fundamental reference frequency signal that is at the nominal reference frequency.

Further, baseband processor 60 and/or system controller 62 may dynamically adjust m and F as needed over time to dynamically track changing error in the oscillator circuit 70. As one example, the output frequency of oscillator circuit 70 may not be compensated for temperature and thus may exhibit a significant temperature coefficient. By observing the output from oscillator circuit 70, or by tracking temperature changes and using assumed or calibrated temperature coefficient data for oscillator circuit 70, the values of m and/or F can be adjusted over time such that the error nulling tracks the changing error. Of course, those skilled in the art will appreciate that with the fine adjustment afforded by the present invention, error nulling may be made to track other environmental and process variations, such as supply voltage, etc.

In any case, the present invention offers obvious advantages to devices that require precision timing and synchronization, such as mobile terminals, but it can be applied to any type of device that uses clock signals of one sort or another. As such, the present invention is not limited by the foregoing discussion, or by the accompanying drawings. Indeed, the present invention is limited only by the following claims and their reasonable equivalents.

What is claimed is:

1. A method of generating an output clock signal having a desired frequency relationship to a reference signal, the method comprising:
   generating the output clock signal in a ring oscillator circuit that provides different phases of the output clock signal;
   generating in a dithering circuit a non-uniform sequence of phase selection values having an arbitrary time-average value m that defines a desired, fixed frequency relationship between the output clock signal and the reference signal;
   controlling an oscillation frequency of the ring oscillator circuit based on selecting a phase of the output clock signal at each cycle of the reference signal and comparing the selected phase of the output clock signal to the reference signal; and
   fixing the oscillation frequency of the ring oscillator according to the desired, fixed frequency relationship between the output clock signal and the reference signal by selecting phases of the output clock for comparison according to the non-uniform sequence of phase selection values.

2. The method of claim 1, further comprising shifting the frequency spectrum of phase noise in the output clock signal outside a frequency range of interest by generating the non-uniform sequence of phase selection values as a non-uniform numeric sequence that does not have periodic sequence pattern variations falling within that frequency range of interest.

3. The method of claim 1, wherein generating the non-uniform sequence of phase selection values comprises generating a non-uniform numeric sequence that is not periodic within a frequency range of interest as defined by the reference signal or output clock signal.

4. The method of claim 1, wherein generating the non-uniform sequence of phase selection values comprises generating a non-uniform sequence exhibiting having the desired time-average value m while simultaneously exhibiting randomized phase noise.

5. The method of claim 1, wherein generating the non-uniform sequence of phase selection values comprises generating a sequence of numeric values having at least one of variable phase selection step size and a variable phase selection direction.

6. The method of claim 1, wherein the dithering circuit comprises a delta-sigma modulation circuit having a modulation resolution matched to a desired precision for the time-average value m.

7. The method of claim 1, further comprising, when the output clock signal is locked at the desired, fixed frequency relationship, using clock edges in the reference signal to remove accumulated timing jitter in the ring oscillator circuit.

8. The method of claim 7, wherein using clock edges in the reference signal to remove accumulated timing jitter in the ring oscillator circuit comprises nulling time jitter at each stage of the ring oscillator circuit by connecting an input of each stage to an output of the preceding stage in advance of each reference clock edge and connecting the input of each stage to the reference signal after each reference clock edge.

9. The method of claim 1, wherein the reference signal comprises an oscillator output signal and wherein the method further comprises determining a frequency error of the oscillator output signal relative to a nominal oscillation frequency and generating the non-uniform sequence of phase selection values such that the clock output signal is at the nominal oscillation frequency.

10. The method of claim 1, wherein the reference signal comprises an oscillator output signal, and wherein the method further comprises receiving at a communication device one or more signals from a remote transmitter, determining a frequency error of the oscillator output signal based on the one or more signals, and generating the non-uniform sequence of phase selection values to null the frequency error from the output clock signal.

11. The method of claim 10, further comprising using the output clock signal rather than the oscillator output signal as a system clock signal for clocking one or more clocked circuits in the communication device such that the frequency error of the oscillator output signal does not cause timing drift between the clocked circuits in the communication device and the remote transmitter.

12. A frequency synthesizer circuit configured to generate an output clock signal having a desired frequency relationship to a reference signal and comprising:
  a ring oscillator circuit configured to generate an output clock signal and to provide different phases of the output clock signal;
  an oscillator control circuit configured to control an oscillation frequency of the ring oscillator circuit based on comparing a selected phase of the output clock signal to the reference signal at each cycle of the reference signal and;
  a phase selection circuit configured to feedback selected phases of the output clock signal to the oscillator control circuit according to a non-uniform sequence of phase selection values having an arbitrary time-average value m that defines a desired, fixed frequency relationship between the output clock signal and the reference signal, said phase selection circuit including a dithering circuit configured to generate the non-uniform sequence of phase selection values.

13. The frequency synthesizer circuit of claim 12, wherein the phase selection circuit is configured to shift the frequency spectrum of phase noise in the output clock signal outside a frequency range of interest by generating the non-uniform sequence of phase selection values as a non-uniform numeric sequence that does not have periodic sequence pattern variations falling within that frequency range of interest.

14. The frequency synthesizer circuit of claim 12, wherein the phase selection circuit is configured to generate the non-uniform sequence of phase selection values as a non-uniform numeric sequence that is not periodic within a frequency range of interest as defined by the reference signal or output clock signal.

15. The frequency synthesizer circuit of claim 12, wherein the phase selection circuit is configured to generate the non-uniform sequence of phase selection values as a non-uniform sequence exhibiting having the desired time-average value m while simultaneously exhibiting randomized phase noise.

16. The frequency synthesizer circuit of claim 12, wherein the phase selection circuit is configured to generate the non-uniform sequence of phase selection values as a sequence of numeric values having at least one of variable phase selection step size and a variable phase selection direction.

17. The frequency synthesizer circuit of claim 12, wherein the dithering circuit comprises a delta-sigma modulation circuit having a modulation resolution matched to a desired precision for the time-average value m.

18. The frequency synthesizer circuit of claim 12, wherein the frequency synthesizer circuit further includes a jitter reduction circuit that is configured to use clock edges in the reference signal to remove accumulated timing jitter in the ring oscillator circuit when the output clock signal is locked at the desired, fixed frequency relationship.

19. The frequency synthesizer circuit of claim 18, wherein the jitter reduction circuit is configured to use the clock edges in the reference signal to remove accumulated timing jitter in the ring oscillator circuit by nulling time jitter at each stage of the ring oscillator circuit by connecting an input of each stage to an output of the preceding stage in advance of each reference clock edge and connecting the input of each stage to the reference signal after each reference clock edge.

20. The frequency synthesizer circuit of claim 12, wherein the reference signal comprises an oscillator output signal and wherein the frequency synthesizer circuit is configured to determine a frequency error of the oscillator output signal relative to a nominal oscillation frequency and generate the phase sequence such that the clock output signal is at the nominal oscillation frequency.

21. A wireless communication terminal comprising a frequency synthesizer circuit configured to:
  generate an output clock signal in a ring oscillator circuit that provides different phases of the output clock signal;
  generate in a dithering circuit a non-uniform sequence of phase selection values having an arbitrary time-average value m that defines a desired, fixed frequency relationship between the output clock signal and a reference signal;
  control an oscillation frequency of the ring oscillator circuit based on selecting a phase of the output clock signal at each cycle of the reference signal and comparing the selected phase of the output clock signal to the reference signal; and
  fix the oscillation frequency of the ring oscillator according to the desired, fixed frequency relationship between the output clock signal and the reference signal by selecting phases of the output clock for comparison according to the non-uniform sequence of phase selection values.

22. The wireless communication terminal of claim 21, wherein the reference signal comprises an oscillator output signal, and wherein the frequency synthesizer is configured to determine a frequency error of the oscillator output signal based on one or more signals received from a remote transmitter by the wireless communication terminal and generate the phase selection sequence to null the frequency error from the output clock signal.

23. The wireless communication terminal of claim 21, wherein the wireless communication terminal is configured to use the output clock signal rather than the oscillator output signal as a system clock signal for clocking one or more clocked circuits in the wireless communication terminal such that the frequency error of the oscillator output signal does not cause timing drift between the clocked circuits in the wireless communication terminal and the remote transmitter.

* * * * *